United States Patent
Liu et al.

(10) Patent No.: US 11,832,403 B2
(45) Date of Patent: Nov. 28, 2023

(54) ELECTRONIC DEVICE AND CONNECTION MODULE THEREFOR

(71) Applicant: SHANDONG YINGXIN COMPUTER TECHNOLOGIES CO., LTD., Shandong (CN)

(72) Inventors: Tingwei Liu, Shandong (CN); Xiaozheng Li, Shandong (CN)

(73) Assignee: SHANDONG YINGXIN COMPUTER TECHNOLOGIES CO., LTD., Shandong (CN)

( * ) Notice: Subject to any disclaimer, the term of this patent is extended or adjusted under 35 U.S.C. 154(b) by 0 days.

(21) Appl. No.: 18/016,443

(22) PCT Filed: Feb. 28, 2022

(86) PCT No.: PCT/CN2022/078467
§ 371 (c)(1),
(2) Date: Jan. 16, 2023

(87) PCT Pub. No.: WO2022/199333
PCT Pub. Date: Sep. 29, 2022

(65) Prior Publication Data
US 2023/0213986 A1 Jul. 6, 2023

(30) Foreign Application Priority Data

Mar. 26, 2021 (CN) .......................... 202110327637.1

(51) Int. Cl.
*H05K 5/02* (2006.01)
(52) U.S. Cl.
CPC .................................. *H05K 5/0221* (2013.01)
(58) Field of Classification Search
CPC .. G06F 1/181; E05B 65/006; Y10T 292/0839; Y10T 292/0838; Y10T 292/0845; H05K 5/0221
See application file for complete search history.

(56) References Cited

U.S. PATENT DOCUMENTS

| | | | | |
|---|---|---|---|---|
| 4,559,880 A | * | 12/1985 | Lacka | ....................... E05G 1/00 109/51 |
| 6,601,884 B2 | * | 8/2003 | Bastian | .................. E05C 3/165 292/222 |
| 11,297,730 B1 | * | 4/2022 | Tsorng | ................ H05K 7/1402 |

FOREIGN PATENT DOCUMENTS

| | | |
|---|---|---|
| CN | 101873777 A | 10/2010 |
| CN | 102111979 A | 6/2011 |

(Continued)

OTHER PUBLICATIONS

PCT/CN2022/078467 international search report.
CN 202110327637.1 first office action and search report.

*Primary Examiner* — James Wu
(74) *Attorney, Agent, or Firm* — IPro, PLLC

(57) ABSTRACT

The present application discloses an electronic device and a connection module therefor. The connection module includes a first connection piece and a second connection piece; side walls of the first connection piece is each provided with notches and a limiting end which are connected to each other and are arranged at an angle; the second connection piece is provided with limiting pieces adapted to be placed at the limiting ends by means of the notches; one of the first connection piece and the second connection piece is provided with a retractable positioning assembly, and the side walls of the other are provided with positioning holes fastening the retractable positioning assembly, so that when the limiting pieces are placed at the limiting ends, the retractable positioning assembly is fastened in the positioning holes.

19 Claims, 7 Drawing Sheets

(56) References Cited

FOREIGN PATENT DOCUMENTS

| | | | |
|---|---|---|---|
| CN | 107526404 | A | 12/2017 |
| CN | 108415530 | A | 8/2018 |
| CN | 108496414 | A | 9/2018 |
| CN | 109032277 | A | 12/2018 |
| CN | 109189181 | A | 1/2019 |
| CN | 110265943 | A | 9/2019 |
| CN | 110502076 | A | 11/2019 |
| CN | 211655771 | U | 10/2020 |
| CN | 112367176 | A | 2/2021 |
| CN | 113031718 | A | 6/2021 |
| CN | 113099653 | A | 7/2021 |
| JP | 2005150666 | A | 6/2005 |
| JP | 2006202797 | A | 8/2006 |
| WO | 2016123871 | A1 | 8/2016 |

* cited by examiner

ELECTRONIC DEVICE AND CONNECTION MODULE THEREFOR

This application claims the priority of the Chinese patent application filed on Mar. 26, 2021 before the CNIPA, China National Intellectual Property Administration with the application number of 202110327637.1 and the title of "ELECTRONIC DEVICE AND CONNECTION MODULE THEREFOR", which is incorporated herein in its entirety by reference.

FIELD

The present application relates to the technical field of servers, in particular to a connection module. The present application also relates to an electronic device of the connection module.

BACKGROUND

With the development of the Internet technology, the demand for servers in various fields is increasing, and the types of servers are increasing. An upper cover of the server is the first line of defense to protect every part of the server, so almost all servers on the market have the upper cover.

With the increase of labor cost, in order to reduce the cost of server assembly and maintenance, the design of the upper cover of the server should be able to realize the function of fast labor-saving and tool-free disassembly and assembly. At present, the upper cover of the server and the chassis of the server are fixed by clamping in the form of hoist mouth, etc., and locked with the upper cover lock module. However, due to vibration or falling and other factors during transportation, the upper cover will be torsional deformed or move back and forth relative to the chassis base, which will cause the locking failure of the mounting position, and the upper cover is easy to fail and fall back or fall off, which is a high risk.

SUMMARY

The object of the present application is to provide a connection module capable of preventing two connecting pieces from falling off due to relative movement or torsional deformation. Another object of the present application is to provide an electronic device using the above-described connection module.

In order to achieve the above object, the present application provides a connection module, including a first connecting piece and a second connecting piece, a side wall of the first connecting piece is provided with a notch and a limit end that are connected to each other and arranged at an angle, and the second connecting piece is provided with a limit piece for being placed at the limit end through the notch; and one of the first connecting piece and the second connecting piece is provided with a telescopic positioning component, and a side wall of the other is provided with a positioning hole which is embedded with the telescopic positioning component, so that when the limit piece is placed at the limit end, the telescopic positioning component is embedded in the positioning hole.

In some embodiments of the present application, a bottom of the first connecting piece) is provided with a locking rivet, the second connecting piece is provided with an upper cover lock in flip-fit cooperation with the locking rivet, and the upper cover lock is provided with a driving part for driving the telescopic positioning component to move, so that when the upper cover lock flip-buckles to the second connecting piece, the upper cover lock locks with the locking rivet and drives the telescopic positioning component lock relative to the positioning hole.

In some embodiments of the present application, the upper cover lock includes an upper cover lock base, an upper cover lock slider and an upper cover lock cover plate, and the upper cover lock slider is provided with a slider hole cooperating with the locking rivet; and the upper cover lock cover plate is in flip connection with the upper cover lock base and drives the upper cover lock slider to slide reciprocally along the upper cover lock base when the upper cover lock plate is overturned open or closed; and the slider hole is locked with the locking rivet when the upper cover lock cover plate is buckled.

In some embodiments of the present application, the telescopic positioning component includes a driving spring and a pair of telescopic rods; and the telescopic rod is provided with a limiting boss, the driving spring presses against the limiting boss to retract the telescopic rod; the driving part is provided on the upper cover lock cover plate and moves downwards to compress and drive a pair of the telescopic rods to open and extend when the upper cover lock cover plate is buckled.

In some embodiments of the present application, upper parts of adjacent ends of the pair of telescopic rods are provided with oblique chamfers, and lower ends of the driving part are provided with extruded bevel edges which cooperate with the oblique chamfers.

In some embodiments of the present application, the telescopic positioning component includes a driving spring, a pair of telescopic rods and a traction piece connecting the pair of telescopic rods; and the telescopic rod is provided with a limiting boss; the driving spring presses against the limiting boss to extend the telescopic rod; the driving part is a button assembly for pressing down the traction piece to pull the telescopic rod to retract; and the button assembly is driven to be pressed down when the upper cover lock cover plate is open, and the button assembly is reset when the upper cover lock cover plate is buckled.

In some embodiments of the present application, the button assembly includes a button body, a button base, a button spring and a button lifting column;

a top end of the button lifting column passes through the button base and is rotatably connected with the button body;

a bottom end of the button lifting column is provided with a button boss and the button spring is compressed between the button base and the button boss; and two sides of the button body are provided with side rods and the upper cover lock cover plate is provided with a lifting arm for lifting the side rods.

In some embodiments of the present application, a bottom of the button boss is provided with a U-shaped trunking for limiting the traction piece.

The present application further provides an electronic device, including the above-mentioned connection module, the first connecting piece is a base and the second connecting piece is a cover.

In some embodiments of the present application, the electronic device is a server.

Compared with the above background technology, the first connecting piece and the second connecting piece of the connection module provided in the present application are matched through the limit piece and the limit end, the limit piece may enter the limit end from the notch to realize the clamping coordination of the two, and the coordination of the telescopic positioning component and the positioning hole may realize the relative locking of the first connecting piece and the second connecting piece after they are assembled in place, so as to avoid the relative movement and torsional deformation of the two causing the limit piece to slide out of the notch, and improve the assembly reliability of the first connecting piece and the second connecting piece. The first connecting piece may be a chassis base of the server, and correspondingly, the second connecting piece may be an upper cover of the chassis. Through the application of the connection module, the problems of inconvenient assembly and low assembly reliability of the upper cover of the chassis are solved.

BRIEF DESCRIPTION OF THE DRAWINGS

In order to explain more clearly the embodiments of the present application or the technical solution in the prior art, the following will be a brief description of the drawings to be used in the description of the embodiments or the prior art. It is obvious that the drawings in the following description are only the embodiment of the present application, and for those of ordinary skill in the art, other drawings may be obtained according to the drawings provided without exerting creative efforts.

Where:

1—First connecting piece, 2—Second connecting piece, 3—Telescopic rod bracket, 4—Telescopic rod, 5—Limiting boss, 6—Driving spring, 7—Fastener, 8—Button assembly, 9—Upper cover lock, 10—Positioning hole, 11—Traction piece, 12—Limit piece, 13—Locking rivet, 14—Upper cover lock cover plate, 15—Driving part, 16—Lifting arm, 17—Hook, 18—Upper cover lock slider, 19—Upper cover lock base, 20—Hook elastic hole, 21—Slider hole, 22—Button body, 23—Side rod, 24—Button pin shaft, 25—Button base, 26—Button lifting column, 27—Button spring, 28—Button boss, 29—U-shaped trunking.

DETAILED DESCRIPTION

The technical solutions in the embodiments of the present application will be clearly and completely described below in conjunction with the drawings in the embodiments of this application. It will be apparent that the described embodiments are only some embodiments of the application and not all embodiments. Based on the embodiments in the present application, all other embodiments obtained by ordinary skills in the art without creative labor are within the scope of protection of the present application.

In order to enable those skilled in the art to better understand the present application, the present application will be further described in detail in connection with the accompanying drawings and embodiments thereof.

Figure 1:
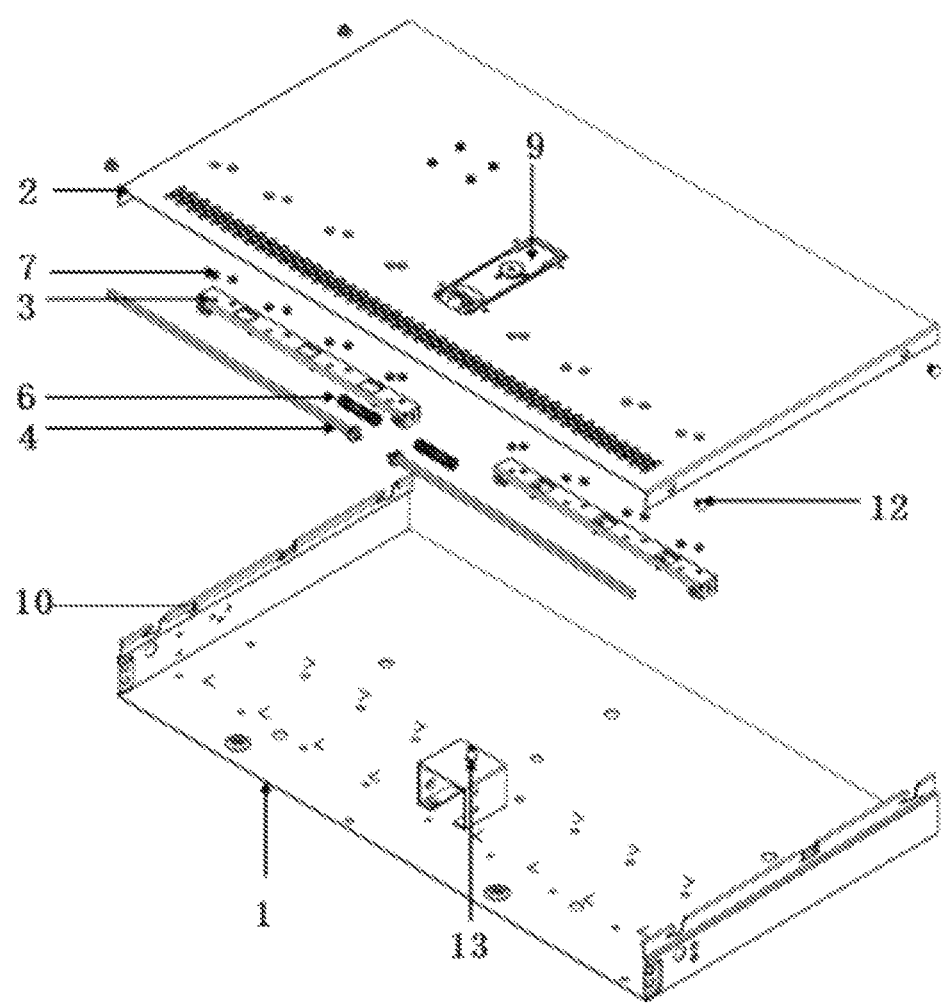
FIG. 1 is an exploded view of a connection module provided in the first embodiment of the present application.
Figure 3:
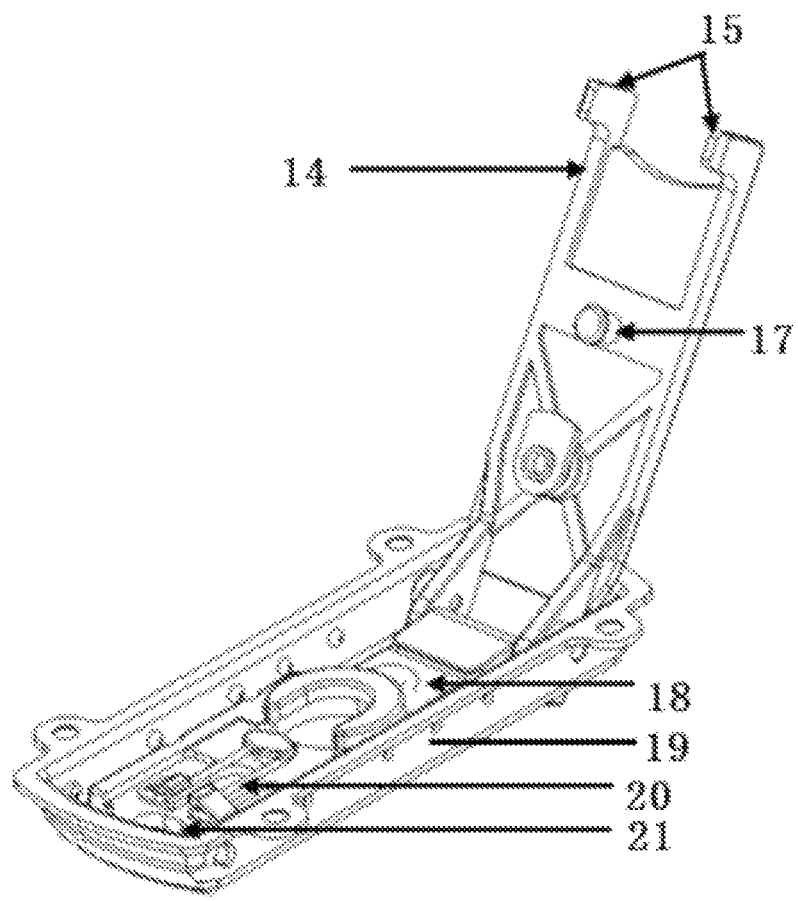
FIG. 3 is a schematic diagram when the upper cover lock in FIG. 1 is opened.
Figure 4:
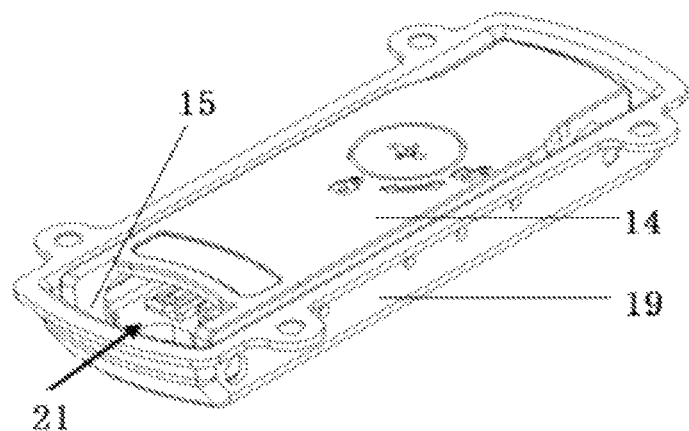
FIG. 4 is a schematic diagram when the upper cover lock in FIG. 1 is buckled.
Figure 5:
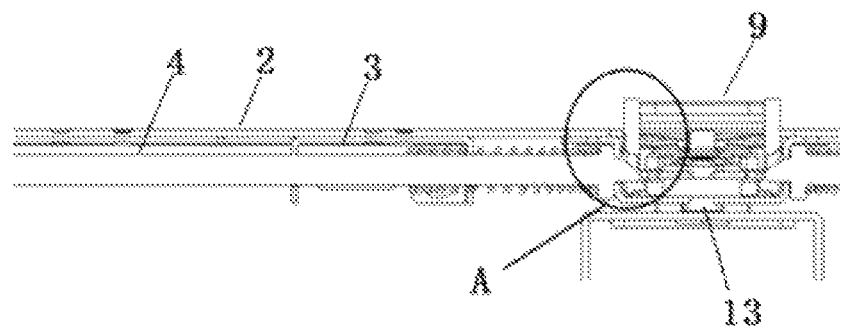
FIG. 5 is a schematic diagram of the telescopic positioning component in a retracted state.
Figure 6:
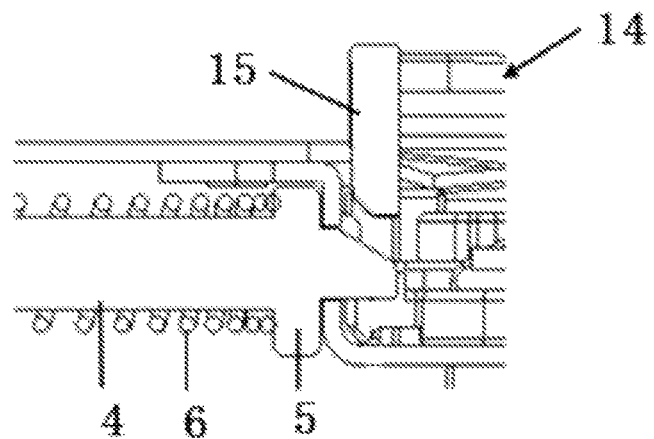
FIG. 6 is an enlarged view of part A of FIG. 5.
Figure 7:
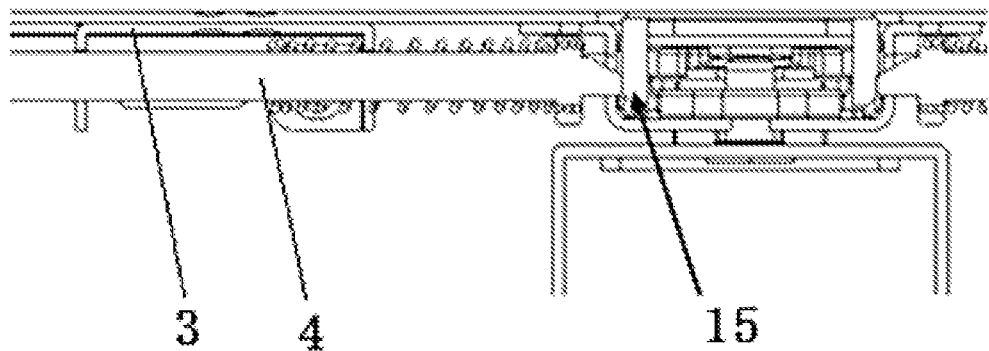
FIG. 7 is a schematic diagram of the extruded extension of the telescopic positioning component.
Figure 8:
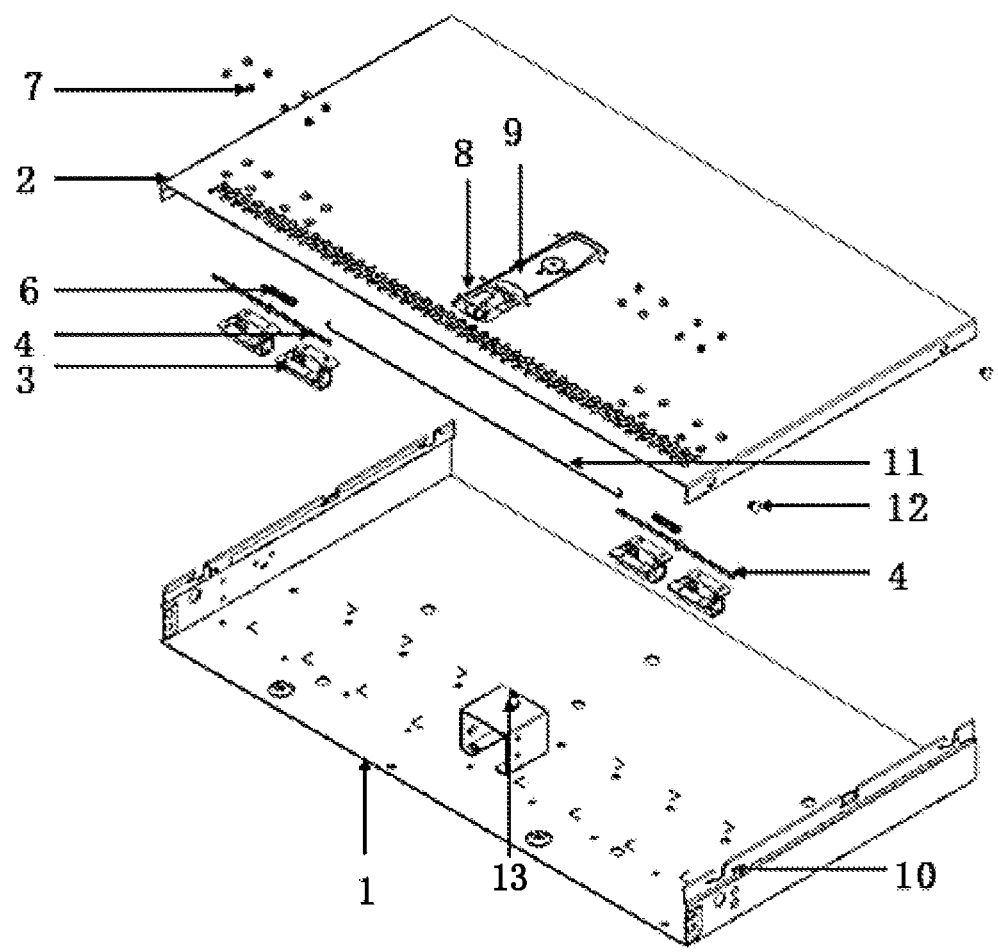
FIG. 8 is an exploded view of the connection module provided in the second embodiment of the present application.
Figure 9:
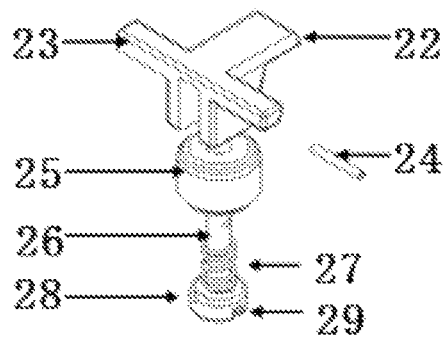
FIG. 9 is an exploded view of the button assembly of FIG. 8.
Figure 10:
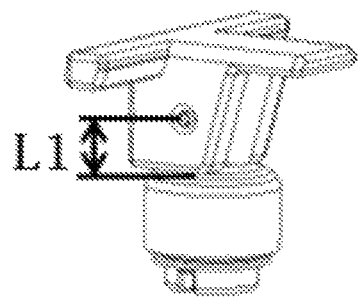
FIG. 10 is a schematic diagram of the button assembly in an initial state.
Figure 11:
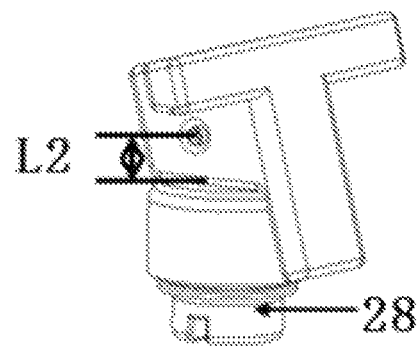
FIG. 11 is a schematic diagram of the button assembly in a pressed state.
Figure 12:
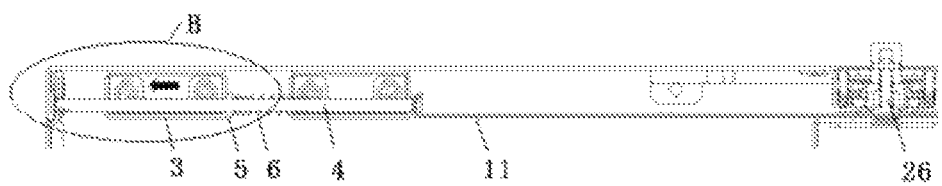
FIG. 12 is a schematic diagram of the telescopic positioning component of FIG. 8.
Figure 13:
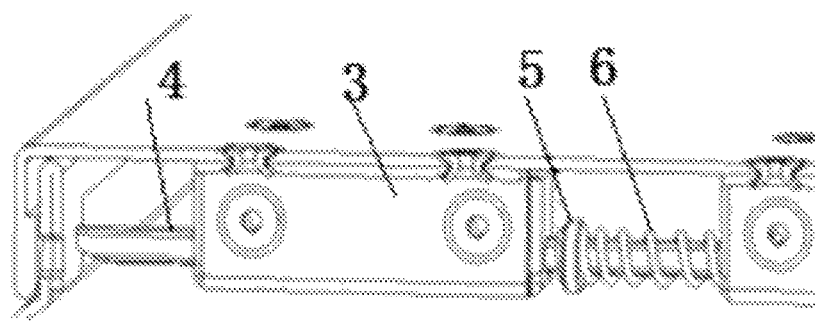
FIG. 13 is an enlarged view of part B of FIG. 12.
Figure 14:
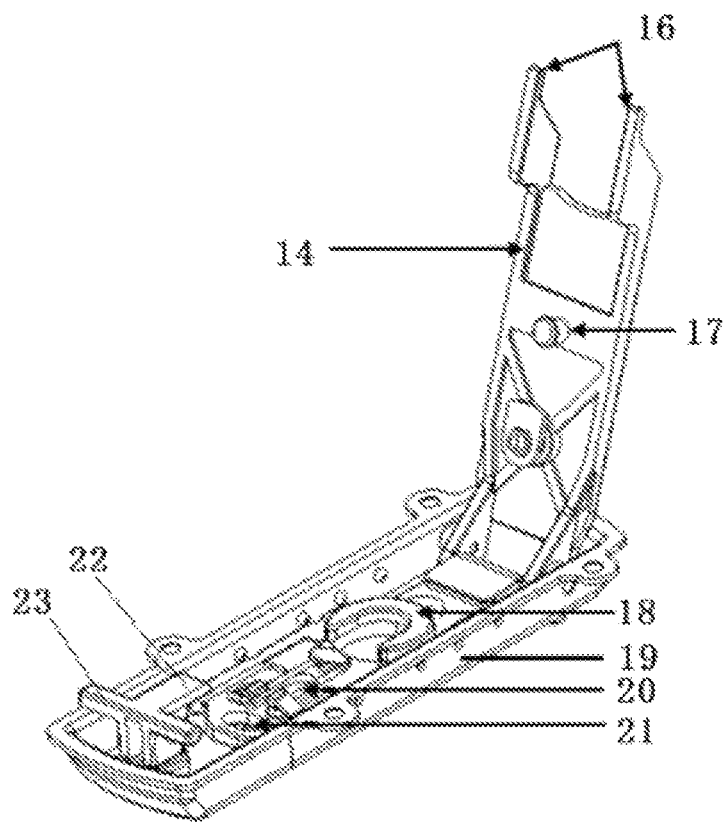
FIG. 14 is a schematic diagram when the upper cover lock in FIG. 8 is opened.
Figure 15:
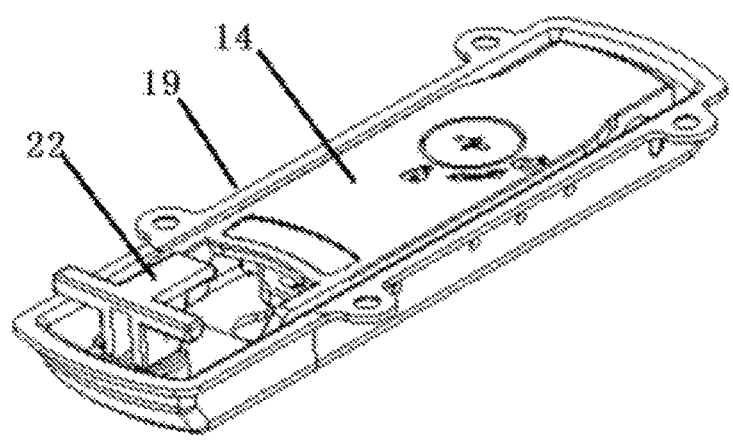
FIG. 15 is a schematic diagram when the upper cover lock in FIG. 8 is buckled.
Figure 16:
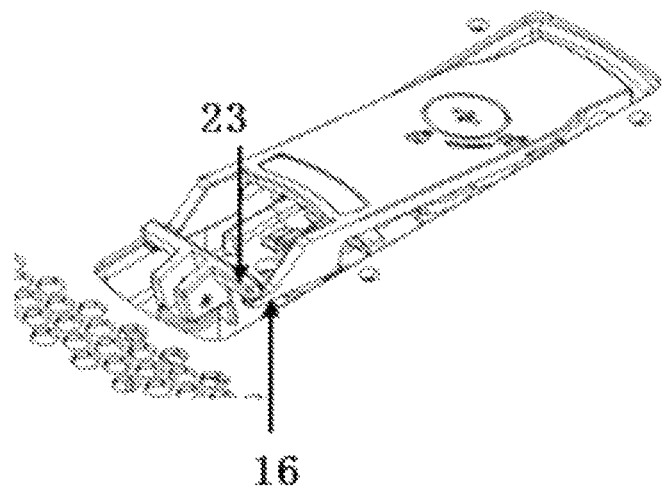
FIG. 16 is a schematic diagram of the linkage of the upper cover lock and the button assembly.

Please refer to FIGS. 1 to 16. FIG. 1 is an exploded view of the connection module provided in the first embodiment of the application, FIG. 2 is a working principle diagram of the limit piece, FIG. 3 is a schematic diagram when the upper cover lock in FIG. 1 is opened, FIG. 4 is a schematic diagram when the upper cover lock in FIG. 1 is buckled, FIG. 5 is a schematic diagram of the telescopic positioning component in a retracted state, FIG. 6 is an enlarged view of the part A of FIG. 5, FIG. 7 is a schematic diagram of the extruded extension of the telescopic positioning assembly, FIG. 8 is an exploded view of connection module provided in the second embodiment of the present application, FIG. 9 is an explosion diagram of the button assembly in FIG. 8, FIG. 10 is a schematic diagram of the button assembly in an initial state, FIG. 11 is a schematic diagram of the button assembly in a pressed state, FIG. 12 is a schematic diagram of the telescopic positioning assembly in FIG. 8, FIG. 13 is an enlarged view of part B in FIG. 12, FIG. 14 is a schematic diagram when the upper cover lock in FIG. 8 is opened, FIG. 15 is a schematic diagram when the upper cover lock in FIG. 8 is buckled, FIG. 16 is a schematic diagram of the linkage of the upper cover lock and the button assembly.

Figure 2:
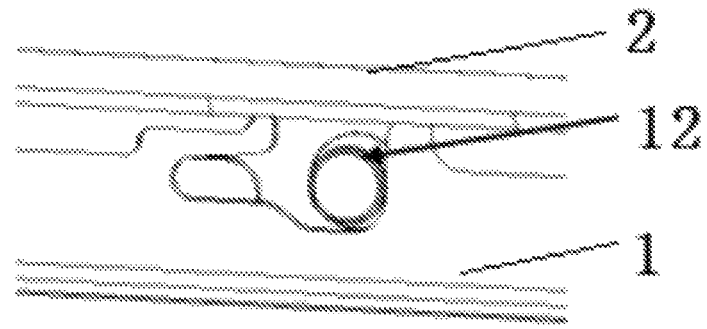
FIG. 2 is a working principal diagram of the limit piece.

As shown in FIGS. 1 and 2, the connection module provided in the present application includes a first connecting piece 1 and a second connecting piece 2. The side wall of the first connecting piece 1 is provided with a notch and a limit end that are communicated with each other, and the limit end and the notch are arranged at a certain angle. Limit pieces 12 are provided on both sides of the second connecting piece 2, so that the limit piece 12 may enter the limit end from the notch to realize the sliding assembly of the first connecting piece 1 and the second connecting piece 2, which is convenient and fast; the limit piece 12 is a T-shaped rivet, and so on.

In order to improve the reliability of the assembly, the present application also particularly provides a telescopic positioning component and a positioning hole 10 between the first connecting piece 1 and the second connecting piece 2. For example, a positioning hole 10 is provided on the side wall of the first connecting piece 1, and the telescopic positioning component is installed on the second connecting piece 2. When the limit piece 12 of the second connecting piece 2 is slidably mounted to the limit end of the first connecting piece 1 from the notch, the relative fixation of the first connecting piece 1 and the second connecting piece 2 is realized by controlling the telescopic positioning component to extend and clamp into the positioning hole 10, so as to avoid the relative movement or torsional deformation of the first connecting pieces 1 and the second connecting piece 2, effectively preventing the limit piece 12 from slipping along the notch, and improving the assembly reliability of the first connecting piece 1 and the second connecting piece 2.

In the above embodiments, the first connecting piece 1 may be a chassis base, correspondingly, the second connecting piece 2 may be the chassis upper cover, the notch and the limit end may be arranged at the top ends of the two side walls of the chassis base, the limit pieces 12 are arranged at the two sides of the chassis upper cover, and the telescopic positioning component is fixedly connected to the bottom of the chassis upper cover. The positioning holes 10 are arranged on the two side walls of the chassis base.

In some embodiments, in order to improve the reliability of the connection between the first connecting piece 1 and the second connecting piece 2, the present application also provides a locking rivet 13 at the center of the bottom of the first connecting piece 1, and an upper cover lock 9 flip-fitted with the locking rivet 13 is provided on the second connecting piece 2. The upper cover lock 9 and the locking rivet 13 are connected and locked by flip-buckling the upper cover lock 9. The present application also provides a driving part 15 on the upper cover lock 9. When the upper cover lock 9 is turned over and buckled, the driving part 15 drives the telescopic positioning component to move synchronously to realize linkage between the telescopic positioning component and the upper cover lock 9.

In some embodiments provided in the present application, the telescopic positioning component includes a pair of telescopic rods 4, a telescopic rod bracket 3 for fixing the telescopic rods 4 to the second connecting piece 2, and a driving spring 6 for driving the retraction of the pair of telescopic rods 4. The pair of telescopic rods 4 are coaxially spaced. The driving spring 6 is sleeved on the telescopic rod 4 in a one-to-one correspondence manner. The telescopic rod bracket 3 is fixed on the second connecting piece 2 by a fastener 7.

A limiting boss 5 is arranged at a preset position of the telescopic rod 4; the driving spring 6 makes the telescopic rod 4 relatively retract by pressing the limiting boss 5, the upper cover lock 9 opens the pair of telescopic rods 4 through the extrusion of the driving part 15 when the upper cover is turned over and buckled, to overcome the elastic force of the driving spring 6 to extend the telescopic rods 4 and clamp them into the positioning hole 10.

As shown in FIGS. 3 and 4, the upper cover lock 9 includes an upper cover lock base 19 and an upper cover lock cover plate 14 rotatably connected with the upper cover lock base 19; an upper cover lock slider 18 capable of sliding along its length direction is arranged in the upper cover lock base 19, which is connected with the upper cover lock cover plate 14 and is driven to slide reciprocate along the upper cover plate base 19 by turning over the upper cover lock cover plate 14. The upper cover lock slider 18 is provided with a slider hole 21. When the upper cover lock cover plate 14 is buckled, the slider hole 21 is locked with the locking rivet 13 arranged on the first connecting piece 1. After the upper cover lock slider 18 slides in place, the second connecting piece 2 is driven to move relative to the first connecting piece 1, and the limit piece 12 is blocked at the limit end. In the embodiment, the driving part 15 is a pair of drive sheets fixedly connected to the end of the upper cover lock cover plate 14 vertically; the two sides of the upper cover lock base 19 are provided with through holes through which the telescopic rod 4 may penetrate.

The principle that the upper cover lock 9 is linked with the driving part 15 to drive the telescopic rod 4 to move is shown in FIGS. 5 to 7. The upper parts of the end, at the inner side of the second connecting piece 2, of the pair of telescopic rods 4 are provided with oblique chamfers, respectively, and the lower end of the driving part 15, i.e., the driving piece is provided with an extruded beveled edge matched with the oblique chamfer. When the upper cover lock cover plate 14 is buckled and the extruded bevel edge of the driving part 15 acts on the oblique chamfer of the inner side of the telescopic rod 4, a driving force in the horizontal direction toward the outside is generated at the oblique chamfer of the telescopic rod 4 due to the oblique arrangement of the contact surfaces between the two, to overcome the elastic force of the driving spring 6 to extrude the telescopic rod 4, and the telescopic rod 4 is embedded in the positioning hole 10 of the first connecting piece 1.

When the first connecting piece 1 and the second connecting piece 2 need to be disassembled, the upper cover lock cover plate 14 is turned over and opened, and the driving part 15 is separated from the pair of telescopic rods 4, under the action of the reset elastic force of the driving spring 6, the telescopic rods 4 are retracted to realize unlocking, and then the limit piece 12 of the second connecting piece 2 is taken out from the limit end of the first connecting piece 1 along the notch.

In addition, a locking mechanism is provided between the upper cover lock cover plate 14 and the upper cover lock base 19/the upper cover lock slider 18. The locking mechanism includes a hook 17 and a hook elastic hole 20 cooperating with each other, and also includes a U-shaped hole and a locking knob cooperating with each other. The locking mechanism may be set by reference to the existing upper cover lock module, and will not be described herein.

Referring to FIGS. 8, 12 and 13, in some embodiments provided in the present application, the telescopic positioning component includes a driving spring 6, a pair of telescopic rods 4 and a traction piece 11 connecting the pair of telescopic rods 4. The pair of telescopic rods 4 are coaxially spaced; the traction piece 11 is connected with adjacent ends of the pair of telescopic rods 4; a limiting boss 5 is arranged on the telescopic rod 4; and the driving spring 6 is sleeved on the telescopic rod 4 and presses against the limiting boss 5. The telescopic rod 4 is fixed on the second connecting piece 2 through the telescopic rod bracket 3 and the fastener 7. The driving spring 6 acts on the limiting boss 5 to extend the telescopic rod 4. The driving part 15 adopts the button assembly 8. By pressing the button assembly 8 to press the traction piece 11, the pair of telescopic rods 4 are driven to overcome the elastic force of the driving spring 6 to retract. After the button assembly 8 is released, the pair of telescopic bars 4 extend outwards under the elastic force of the driving spring 6 to realize the clamping fit with the positioning hole 10 on the first connecting piece 1. The traction piece 11 may use iron wire or soft rope.

The structure of the button assembly 8 is shown in FIGS. 9 to 11. The button assembly 8 includes a button body 22, a button base 25, a button spring 27, and a button lifting column 26. The bottom end of the button lifting column 26 is provided with a button boss 28. The top end of the button lifting column 26 passes through the button base 25 and is rotatably connected with the button body 22, through a button pin shaft 24. The button spring 27 is compressed between button base 25 and button lifting column 26 and is always in a compression state. The two sides of the button body are provided with horizontally extending side rods 23.

When the button assembly 8 is in a first state, a first supporting surface of the button body 22 fits the button base 25, and the distance between the button pin shaft 24 and the button base 25 is L1. When the button assembly 8 is rotated to a second state, a second supporting surface of the button body 22 is attached to the button base 25, and the distance between the button pin shaft 24 and the upper end surface of the button base 25 is L2, and L2 is less than L1. By rotating the button body 22, the distance between the button pin shaft 24 and the upper end surface of the button base 25 may be changed to drive the button lifting column 26 to lift. When the button lifting column 26 drops, the traction piece 11 is pressed down to drive the pair of telescopic rods 4 to retract; when the button lifting column 26 rises, the traction piece 11 is no longer pressed down, and the pair of telescopic rods 4 extend under the elastic force of the driving spring 6 to realize the matching and locking with the positioning hole 10.

In order to realize the linkage between the upper cover lock 9 and the telescopic positioning component through the button assembly 8, the structure of the upper cover lock 9 may be referred to FIGS. 14 to 16. The structure of the upper cover lock 9 is generally the same as that of the above embodiments, including the upper cover lock base 19, the upper cover lock slider 18, the upper cover lock cover plate 14, the hook 17 and the hook elastic hole 20. The difference is that the end of the upper cover lock cover plate 14 is provided with a pair of lifting arms 16 which are matched with the side rods 23. The lower parts of the outer ends of the pair of telescopic rods 4 are provided with oblique chamfers so that when the first connecting piece 1 and the second connecting piece 2 are assembled, the side wall of the first connecting piece 1 acts on the oblique chamfer of the telescopic rods 4 by pressing down the second connecting piece 2, and the telescopic rods 4 are retracted and clamped into the positioning hole 10 under the action of the driving spring 6.

When it is necessary to lock the first connecting piece 1 and the second connecting piece 2 to each other, the limit piece 12 of the second connecting piece 2 is aligned with the notch of the first connecting piece 1, the slider hole 21 is aligned with the locking rivet 13 for assembly, and the side wall of the first connecting piece 1 will extrude the oblique chamfers of the telescopic rod 4 to retract the telescopic rod 4 toward the middle, and the driving spring 6 of the telescopic rod 4 is in the compression state. Then rotate the upper cover lock cover plate 14 downward, under the backward movement of the upper cover lock slider 18 and the coordination of the slider hole 21 and the locking rivet 13, the second connecting piece 2 will move forward along the direction from the notch to the limit end, when it moves all the way to the limit end, the second connecting piece 2 will not move forward any more. At the same time, the telescopic rod 4 also moves into the positioning holes 10 on both sides of the first connecting piece 1 along with the second connecting piece 2. From then on, the telescopic rod 4 is firmly clamped on the first connecting piece 1. Continue to rotate the upper cover lock cover plate 14 to move downwards, and the hook 17 will be clamped in the hook elastic hole 20. From then on, the upper cover lock cover plate 14 is also firmly clamped and may not be rotated any more.

When it is necessary to unlock the first connecting piece 1 and the second connecting piece 2, the finger pulls the upper cover lock cover plate 14 while touching and pressing the button body 22 at the same time. When the button body 22 is pressed, the button body 22 rotates, the distance between the button pin shaft 24 and the button base 25 changes from L1 to L2, the button lifting rod moves downwards, the traction piece 11 at the bottom of the button lifting rod is driven to move downwards, and the traction piece 11 drives the telescopic rod 4 to move to the middle to realize the movement in the vertical direction into the movement in the horizontal direction, the driving spring 6 is in the compression state, the telescopic rod 4 exits the positioning hole 10 of the first connecting piece 1, and the button body 22 will not rebound at this time.

The upper cover lock cover plate 14 is rotated upward, and the upper cover lock slider 18 moves forward. With the cooperation of the slider hole 21 and the locking rivet 13, the second connecting piece 2 will move backward along the direction from the limit end of the first connecting piece 1 to the notch. Since the telescopic rod 4 and the telescopic rod bracket 3 are riveted on the second connecting piece 2, they will also move backward along the second connecting piece 2. As the upper cover lock cover plate 14 continues to rotate upward, the lifting arm 16 touches the side rod 23 to drive the button body 22 to rotate and reset.

As the upper cover lock cover plate 14 continues to rotate upwards to drive the second connecting piece 2 to continue to move backwards, when the second connecting piece 2 moves to the notch, the limit piece 12 may be lifted from the notch to unlock the first connecting piece 1 and the second connecting piece 2.

In some embodiments, the bottom of the button boss 28 is provided with a U-shaped trunking 29 through which the traction piece 11 is limited to avoid slipping of the traction piece 11 relative to the button boss 28 and to improve the reliability of the button assembly 8 driving the telescopic positioning component.

In the above embodiments, the shapes of the cross section of the telescopic rod 4, the positioning hole 10 and the hole of the telescopic rod bracket 3 for the telescopic rod 4 to pass through may be square, so that the telescopic rod 4 only undergoes an axial telescopic movement without rotation.

The present application also discloses an electronic device including the connection module as described in any of the above embodiments. The electronic equipment may be a server. Correspondingly, the first connecting piece 1 is a chassis base and the second connecting piece 2 is a chassis upper cover. The chassis base and the chassis upper cover adopt the assembly structure of the above-mentioned connection module, which improves the convenience and reliability of the assembly of the server chassis, and effectively avoids the separation of the chassis upper cover and the chassis base caused by torsional deformation or misalignment movement of the chassis upper cover.

It is to be noted that, in this specification, relational terms such as first and second are used only to distinguish one entity from several other entities and do not necessarily require or imply any such actual relationship or order between these entities.

The electronic device and its connection modules provided in the present application are described in detail above. The principles and embodiments of the present application are described herein with the application of specific examples. The description of the above embodiments is only intended to assist in understanding the method and the core idea of the present application. It should be pointed out that for a person of ordinary skill in the art, several improvements and modifications may also be made to the present application without departing from the principles of the present application, and these improvements and modifications also fall within the scope of protection of the claims of the present application.

The invention claimed is:

1. A connection module, wherein the connection module comprising: a first connecting piece and a second connecting piece, a side wall of the first connecting piece is provided with a notch and a limit end that are connected to each other and arranged at an angle, and the second connecting piece is provided with a limit piece for being placed at the limit end through the notch;
- one of the first connecting piece and the second connecting piece is provided with a telescopic positioning component, and a side wall of the other is provided with a positioning hole which is embedded with the telescopic positioning component, so that when the limit piece is placed at the limit end, the telescopic positioning component is embedded in the positioning hole; and
- a bottom of the first connecting piece is provided with a locking rivet, the second connecting piece is provided with an upper cover lock in flip-fit cooperation with the locking rivet, and the upper cover lock is provided with a driving part for driving the telescopic positioning component to move, so that when the upper cover lock flip-buckles to the second connecting piece, the upper cover lock locks with the locking rivet and drives the telescopic positioning component to lock relative to the positioning hole.

2. The connection module according to claim 1, wherein the upper cover lock comprises an upper cover lock base, an upper cover lock slider and an upper cover lock cover plate, and the upper cover lock slider is provided with a slider hole cooperating with the locking rivet; and
- the upper cover lock cover plate is in flip connection with the upper cover lock base and drives the upper cover lock slider to slide reciprocally along the upper cover lock base when the upper cover lock plate is overturned open or closed; and the slider hole is locked with the locking rivet when the upper cover lock cover plate is buckled.

3. The connection module according to claim 2, wherein the telescopic positioning component comprises a driving spring and a pair of telescopic rods; and
- each of the pair of telescopic rods is provided with a limiting boss, the driving spring presses against the limiting boss to retract the telescopic rod, the driving part is provided on the upper cover lock cover plate and moves downwards to compress and drive the pair of the telescopic rods to open and extend when the upper cover lock cover plate is buckled.

4. The connection module according to claim 3, wherein upper parts of adjacent ends of the pair of telescopic rods are provided with oblique chamfers, and lower ends of the driving part are provided with extruded bevel edges which cooperate with the oblique chamfers.

5. The connection module according to claim 3, wherein the telescopic positioning component further comprises a telescopic rod bracket, and the telescopic rod bracket is used for fixing the telescopic rods to the second connecting piece.

6. The connection module according to claim 5, wherein the telescopic rod bracket is fixed on the second connecting piece by a fastener.

7. The connection module according to claim 3, wherein the driving part is a pair of drive sheets fixedly connected to an end of the upper cover lock cover plate vertically.

8. The connection module according to claim 3, wherein two sides of the upper cover lock base are provided with through holes through which the telescopic rods is capable of penetrating.

9. The connection module according to claim 3, wherein the pair of telescopic rods are coaxially spaced, and the driving spring is sleeved on the telescopic rod in a one-to-one correspondence manner.

10. The connection module according to claim 2, wherein the telescopic positioning component comprises a driving spring, a pair of telescopic rods and a traction piece connecting the pair of telescopic rods; and
- each of the pair of telescopic rods is provided with a limiting boss, the driving spring presses against the limiting boss to extend the telescopic rod, the driving part is a button assembly for pressing down the traction piece to pull the telescopic rod to retract; and
- the button assembly is driven to be pressed down when the upper cover lock cover plate is open, and the button assembly is reset when the upper cover lock cover plate is buckled.

11. The connection module according to claim 10, wherein the button assembly comprises a button body, a button base, a button spring and a button lifting column;
- a top end of the button lifting column passes through the button base and is rotatably connected with the button body;
- a bottom end of the button lifting column is provided with a button boss and the button spring is compressed between the button base and the button boss; and
- two sides of the button body are provided with side rods and the upper cover lock cover plate is provided with a lifting arm for lifting the side rods.

12. The connection module according to claim 11, wherein a bottom of the button boss is provided with a U-shaped trunking for limiting the traction piece.

13. The connection module according to claim 11, wherein the top end of the button lifting column passes through the button base and is rotatably connected with the button body through a button pin shaft.

14. The connection module according to claim 13, wherein when the button assembly is in a first state, a first supporting surface of the button body fits the button base, and a distance between the button pin shaft and the button base is L1;
- when the button assembly is rotated to a second state, a second supporting surface of the button body fits the button base, and a distance between the button pin shaft and an upper end surface of the button base is L2;
- wherein L2 is less than L1.

15. The connection module according to claim 11, wherein when the button lifting column drops, the traction piece is pressed down to drive the pair of telescopic rods to retract;
- when the button lifting column rises, the traction piece is no longer pressed down, and the pair of telescopic rods extend under the elastic force of the driving spring to realize the matching and locking with the positioning hole.

16. The connection module according to claim 10, wherein the pair of telescopic rods are coaxially spaced, and the traction piece is connected with adjacent ends of the pair of telescopic rods.

17. The connection module according to claim 10, wherein after the button assembly is released, the pair of telescopic bars extend outwards under the elastic force of the driving spring to realize the clamping fit with the positioning hole on the first connecting piece.

18. The connection module according to claim 2, wherein a locking mechanism is provided between the upper cover lock cover plate and the upper cover lock base or the upper cover lock slider; and the locking mechanism comprises a hook and a hook elastic hole cooperating with each other, and also comprises a U-shaped hole and a locking knob cooperating with each other.

19. An electronic device, wherein the electronic device comprising: a connection module, the connection module comprises a first connecting piece and a second connecting piece, a side wall of the first connecting piece is provided with a notch and a limit end that are connected to each other and arranged at an angle, and the second connecting piece is provided with a limit piece for being placed at the limit end through the notch;

one of the first connecting piece and the second connecting piece is provided with a telescopic positioning component, and a side wall of the other is provided with a positioning hole which is embedded with the telescopic positioning component, so that when the limit piece is placed at the limit end, the telescopic positioning component is embedded in the positioning hole;

the first connecting piece is a base and the second connecting piece is a cover; and a bottom of the first connecting piece is provided with a locking rivet, the second connecting piece is provided with an upper cover lock in flip-fit cooperation with the locking rivet, and the upper cover lock is provided with a driving part for driving the telescopic positioning component to move, so that when the upper cover lock flip-buckles to the second connecting piece, the upper cover lock locks with the locking rivet and drives the telescopic positioning component to lock relative to the positioning hole.

\* \* \* \* \*